US012765039B2

(12) United States Patent
Cai et al.

(10) Patent No.: US 12,765,039 B2
(45) Date of Patent: Oct. 13, 2026

(54) FERROELECTRIC CAPACITIVE MEMORY DEVICES WITH A MULTIPLE-WORK-FUNCTION ELECTRODE

(71) Applicant: GlobalFoundries Singapore Pte. Ltd., Singapore (SG)

(72) Inventors: Xinshu Cai, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 402 days.

(21) Appl. No.: 18/501,170

(22) Filed: Nov. 3, 2023

(65) Prior Publication Data

US 2025/0151369 A1 May 8, 2025

(51) Int. Cl.

| | |
|---|---|
| ***H10D 64/68*** | (2025.01) |
| ***H10B 53/30*** | (2023.01) |
| ***H10D 64/01*** | (2025.01) |
| ***H10D 64/66*** | (2025.01) |
| ***H10W 20/41*** | (2026.01) |

(52) U.S. Cl.

CPC ........... *H10D 64/689* (2025.01); *H10B 53/30* (2023.02); *H10D 64/033* (2025.01); *H10D 64/664* (2025.01); *H10W 20/435* (2026.01)

(58) Field of Classification Search

CPC .. H10D 64/689; H10D 64/033; H10D 64/664; H10B 53/30; H10B 51/30; H10W 20/435

See application file for complete search history.

(56) References Cited

U.S. PATENT DOCUMENTS

2002/0008263 A1* 1/2002 Hirano .................. H10B 53/00 257/296
2020/0403079 A1* 12/2020 Hong ..................... H10B 12/34
2021/0320111 A1* 10/2021 Yeong ................ H10D 30/6211

(Continued)

OTHER PUBLICATIONS

Z. Zhou et al., "Experimental Demonstration of An Inversion-Type Ferroelectric Capacitive Memory and its 1 kbit Crossbar Array Featuring High CHCS/CLCS, Fast Speed, and Long Retention," 2022 IEEE Symposium on VLSI Technology and Circuits (VLSI Technology and Circuits), Honolulu, HI, USA, 2022, pp. 357-358, doi: 10.1109/VLSITechnologyandCir46769.2022.9830291.

(Continued)

*Primary Examiner* — Sue A Purvis
*Assistant Examiner* — Noor Mohammad Ismail Tahir
(74) *Attorney, Agent, or Firm* — Thompson Hine LLP

(57) ABSTRACT

Structures for a ferroelectric capacitive memory device and methods of forming a structure for a ferroelectric capacitive memory device. The structure comprises a first electrode including a first doped region in a semiconductor layer and a second doped region in the semiconductor layer, an interconnection that is configured to connect the first doped region to the second doped region, a ferroelectric layer on the semiconductor layer, and a second electrode including a first section and a second section on the ferroelectric layer. The first section of the second electrode comprises a first material with a first work function, and the second section of the second electrode comprises a second material with a second work function that is greater than the first work function of the first material.

20 Claims, 4 Drawing Sheets

(56) References Cited

U.S. PATENT DOCUMENTS

2023/0142157 A1 * 5/2023 Liao .................. H10D 30/0243
257/368

OTHER PUBLICATIONS

W. Long, H. Ou, J. . - M. Kuo and K. K. Chin, "Dual-material gate (DMG) field effect transistor," in IEEE Transactions on Electron Devices, vol. 46, No. 5, pp. 865-870, May 1999, doi: 10.1109/16.760391.

Y.-K. Lin et al., "Modeling of Back-Gate Effects on Gate-Induced Drain Leakage and Gate Currents in UTB SOI MOSFETs," in IEEE Transactions on Electron Devices, vol. 64, No. 10, pp. 3986-3990, Oct. 2017, doi: 10.1109/TED.2017.2735455.

J.-W. Han, S.-W. Ryu, S.-J. Choi and Y.-K. Choi, "Gate-Induced Drain-Leakage (GIDL) Programming Method for Soft-Programming-Free Operation in Unified RAM (URAM)," in IEEE Electron Device Letters, vol. 30, No. 2, pp. 189-191, Feb. 2009, doi: 10.1109/LED.2008.2010345.

* cited by examiner

FERROELECTRIC CAPACITIVE MEMORY DEVICES WITH A MULTIPLE-WORK-FUNCTION ELECTRODE

BACKGROUND

The present disclosure relates to semiconductor device fabrication and integrated circuits and, more specifically, to structures for a ferroelectric capacitive memory device and methods of forming a structure for a ferroelectric capacitive memory device.

A ferroelectric capacitor consists of a layer of ferroelectric material disposed between a pair of electrodes that can be used to apply a bidirectional electric field. When deployed in a ferroelectric capacitive memory device, a ferroelectric capacitor can be selectively switched by the bidirectional electric field between a high capacitance condition and a low capacitance condition representing different net polarization states of the ferroelectric material. The different capacitance conditions may be used to program the ferroelectric capacitive memory device with non-volatile binary logic states.

Improved structures for a ferroelectric capacitive memory device and methods of forming a structure for a ferroelectric capacitive memory device are needed.

SUMMARY

In an embodiment of the invention, a structure for a ferroelectric capacitive memory device is provided. The structure comprises a first electrode including a first doped region in a semiconductor layer and a second doped region in the semiconductor layer, an interconnection that is configured to connect the first doped region to the second doped region, a ferroelectric layer on the semiconductor layer, and a second electrode including a first section and a second section on the ferroelectric layer. The first section of the second electrode comprises a first material with a first work function, and the second section of the second electrode comprises a second material with a second work function that is greater than the first work function of the first material.

In an embodiment of the invention, a method of forming a structure for a ferroelectric capacitive memory device is provided. The method comprises forming a ferroelectric layer on a semiconductor layer, forming a second electrode that includes a first section and a second section on the ferroelectric layer, and forming a first electrode that includes a first doped region in the semiconductor layer and a second doped region in the semiconductor layer. The first section of the second electrode comprises a first material with a first work function, and the second section of the second electrode comprises a second material with a second work function that is greater than the first work function of the first material. The method further comprises forming an interconnection that is configured to connect the first doped region to the second doped region.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
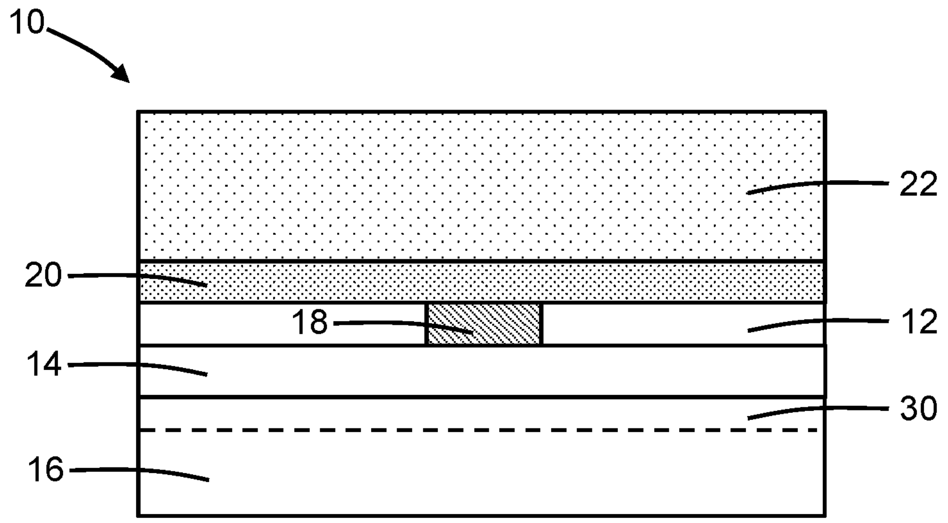
FIG. 1 is a cross-sectional view of a structure at an initial fabrication stage of a processing method in accordance with embodiments of the invention.

With reference to FIG. 1 and in accordance with embodiments of the invention, a structure 10 may be formed using a semiconductor layer 12. The semiconductor layer 12 may be separated from a semiconductor substrate 16 by a dielectric layer 14. The semiconductor layer 12 may be comprised of a semiconductor material, such as single-crystal silicon. The dielectric layer 14 may be comprised of a dielectric material, such as silicon dioxide, that is an electrical insulator. The semiconductor substrate 16 may be comprised of a semiconductor material, such as single-crystal silicon. The semiconductor layer 12, the dielectric layer 14, and the semiconductor substrate 16 may be integrated into a silicon-on-insulator substrate.

A shallow trench isolation region 18 may be formed in the semiconductor layer 12. The shallow trench isolation region 18 may be formed by patterning a shallow trench extending through the semiconductor layer 12 to the dielectric layer 14, depositing a dielectric material, such as silicon dioxide, to fill the shallow trench, and planarizing and/or recessing the deposited dielectric material.

A doped region 30 may be disposed in the semiconductor substrate 16 beneath the dielectric layer 14 and may function as a back gate in the structure 10. The doped region 30 may be formed by introducing a dopant with, for example, ion implantation into the semiconductor substrate 16. A patterned implantation mask may be formed on the top surface of the semiconductor layer 12 to define a selected surface area that is exposed for implantation. The implantation mask may include a layer of an organic photoresist that is applied and patterned to form an opening exposing the selected area on the top surface of the semiconductor layer 12 and determining, at least in part, the location and horizontal dimensions of the doped region 30 in the semiconductor substrate 16. The implantation mask, which is stripped following implantation, has a thickness and stopping power sufficient to block implantation in masked areas. The implantation conditions, such as ion species, dose, and kinetic energy, may be selected to tune the electrical and physical characteristics of the doped region 30. In an embodiment, the doped region 30 may be doped with a concentration of an n-type dopant, such as arsenic or phosphorus, to provide n-type conductivity.

A ferroelectric layer 20 may be formed on the semiconductor layer 12 and shallow trench isolation region 18. The ferroelectric layer 20 may be comprised of a ferroelectric material, such as a high-k dielectric material like hafnium-aluminum oxide, deposited by, for example, atomic layer deposition. The ferroelectric material of the ferroelectric layer 20, which is an electrical insulator, may be crystallized by an anneal following deposition. In an embodiment, the ferroelectric layer 20 may include crystalline grains characterized by an orthorhombic phase that exhibits ferroelectricity. An interfacial layer (not shown) may be disposed between the ferroelectric layer 20 and the semiconductor layer 12 and may comprised of a dielectric material, such as silicon dioxide, that is an electrical insulator and differs in composition from the ferroelectric layer 20. In an embodiment, a uniform thickness of the ferroelectric material of the ferroelectric layer 20 may fully overlap with the entirety of the semiconductor layer 12 and shallow trench isolation region 18.

An electrode layer 22 is disposed on the ferroelectric layer 20. In an embodiment, the electrode layer 22 may directly contact the ferroelectric layer 20. The electrode layer 22, which may be formed by deposition on the ferroelectric layer 20, is comprised of a material having a work function. In an embodiment, the electrode layer 22 may be comprised of polysilicon doped with an n-type dopant. An n-type dopant may be effective to lower the work function of polysilicon relative to intrinsic polysilicon.

Figure 2:
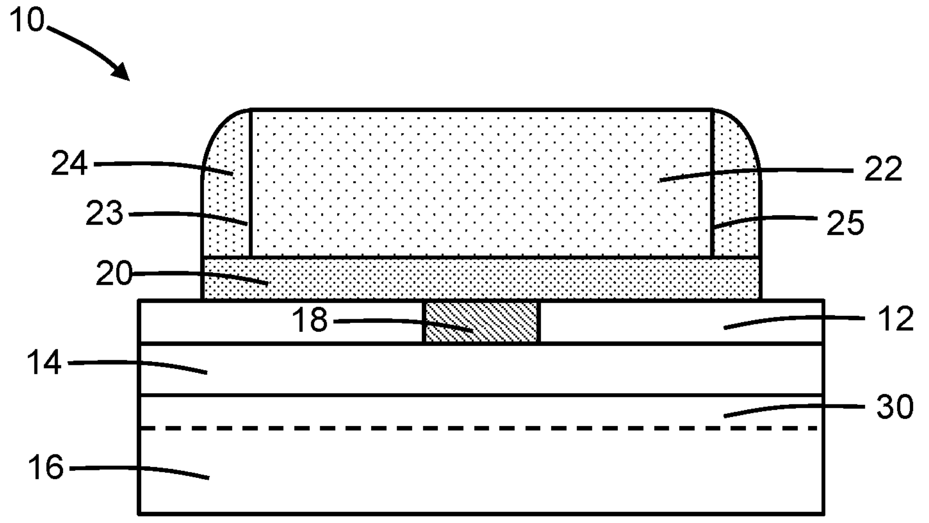
FIG. 2 is a cross-sectional view of the structure at a fabrication stage of the processing method subsequent to FIG. 1.

With reference to FIG. 2 in which like reference numerals refer to like features in FIG. 1 and at a subsequent fabrication stage, the electrode layer 22 may be patterned by lithography and etching processes. The patterned electrode layer 22 includes a sidewall 23 and a sidewall 25 opposite to the sidewall 23. Portions of the ferroelectric layer 20 adjacent to the opposite sidewalls 23, 25 are revealed after the electrode layer 22 is patterned.

An electrode layer 24 is disposed in sections on the portions of the ferroelectric layer 20 adjacent to the sidewalls 23, 25 of the patterned electrode layer 22. In an embodiment, the sections of the electrode layer 24 may directly contact the underlying portions of the ferroelectric layer 20 adjacent to the sidewalls 23, 25 of the patterned electrode layer 22. In an embodiment, the electrode layer 24 may be comprised of a material having a work function that is greater than the work function of the electrode layer 22. In an embodiment, the electrode layer 24 may be comprised of polysilicon doped with a p-type dopant. A p-type dopant may be effective to increase the work function of polysilicon relative to intrinsic polysilicon. In an embodiment, the sections of the electrode layer 24 may be formed by conformally depositing a layer of polysilicon and anisotropically etching the deposited layer with, for example, a reactive ion etching process. In an alternative embodiment, the electrode layer 24 may be comprised of p-type polysilicon, titanium nitride, tantalum nitride, aluminum, copper, or a combination of these materials.

Figure 3:
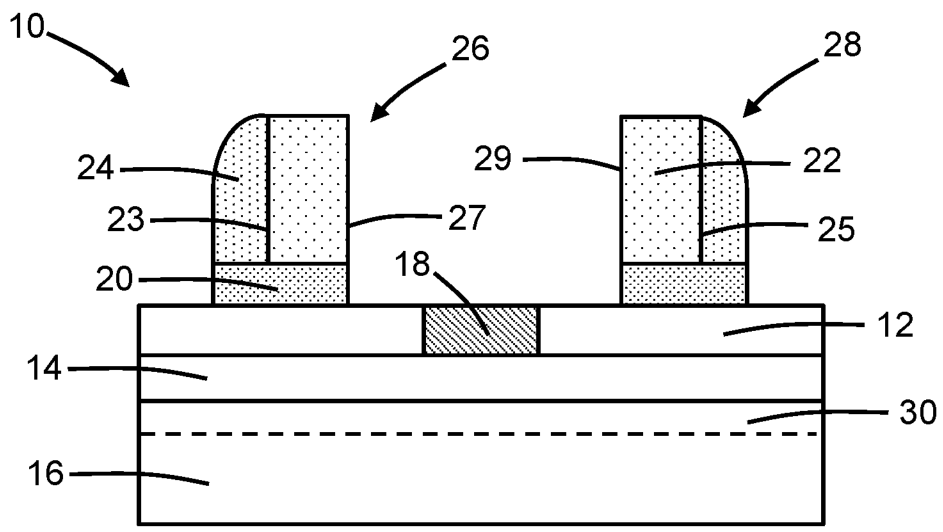
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage, the ferroelectric layer 20 and the electrode layer 22 may be patterned with lithography and etching processes. One of the sections of the patterned electrode layer 22 has a sidewall 27 that is opposite to the sidewall 23, and the other of the sections of the patterned electrode layer 22 has a sidewall 29 that is opposite to the sidewall 25.

Each section of the electrode layer 22 is associated with one of the sections of the electrode layer 24 to define electrodes 26, 28. The electrodes 26, 28 are disposed on patterned sections of the ferroelectric layer 20 over different portions of the semiconductor layer 12. In an embodiment, the section of the electrode layer 22 and the section of the electrode layer 24 in each of the electrodes 26, 28 may be juxtaposed with a side-by-side arrangement. In an embodiment, the section of the electrode layer 22 and the section of the electrode layer 24 in each of the electrodes 26, 28 may be in direct contact. In an embodiment, the section of the electrode layer 22 may laterally adjoin the section of the electrode layer 24 in each of the electrodes 26, 28. In an embodiment, the section of the electrode layer 22 and the section of the electrode layer 24 in each of the electrodes 26, 28 may be coextensive.

Figure 4:
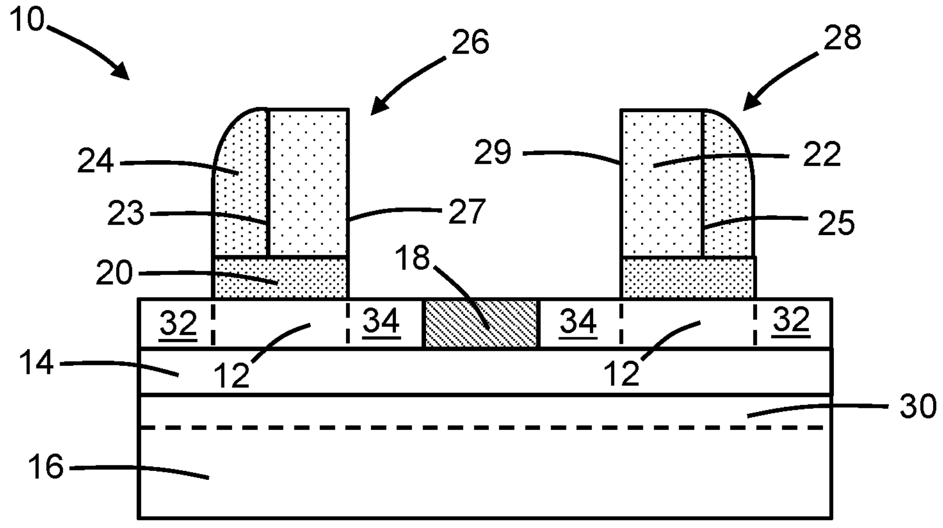
FIG. 4 is a cross-sectional view of the structure at a fabrication stage of the processing method subsequent to FIG. 3.

With reference to FIG. 4 in which like reference numerals refer to like features in FIG. 3 and at a subsequent fabrication stage, doped regions 32, 34 may be disposed in portions of the semiconductor layer 12 adjacent to each of the electrodes 26, 28. The doped regions 32, 34 may be doped to have the same conductivity type. In an embodiment, the doped regions 32, 34 may contain a concentration of an n-type dopant, such as arsenic or phosphorus, to provide n-type conductivity. The doped regions 32, 34 may be concurrently formed by selectively implanting ions, such as ions including the n-type dopant, with an implantation mask having openings defining the intended locations for the doped regions 32, 34 in the semiconductor layer 12. The implantation conditions, such as ion species, dose, and kinetic energy, may be selected to tune the electrical and physical characteristics of the doped regions 32, 34. The electrodes 26, 28 may self-align the formation of the associated doped regions 32, 34 such that sections of the semiconductor layer 12 beneath the electrodes 26, 28 are masked during the formation of the doped regions 32, 34. The shallow trench isolation region 18 is positioned between the doped region 34 associated with the electrode 26 and the doped region 34 associated with the electrode 28.

Figure 5:
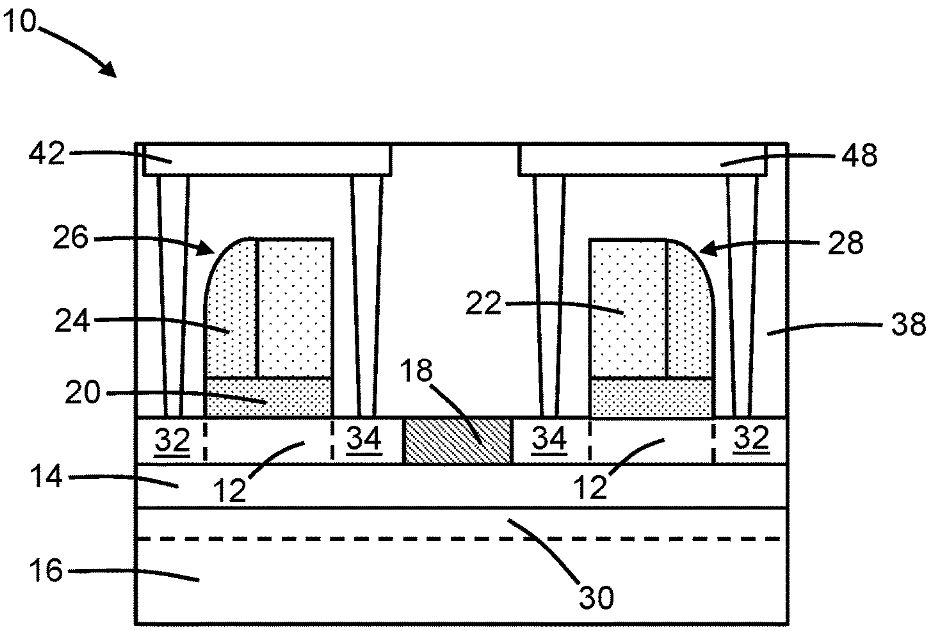
FIGS. 5, 5A are cross-sectional views of the structure, which are taken at different locations, at a fabrication stage of the processing method subsequent to FIG. 4.
Figure 5A:
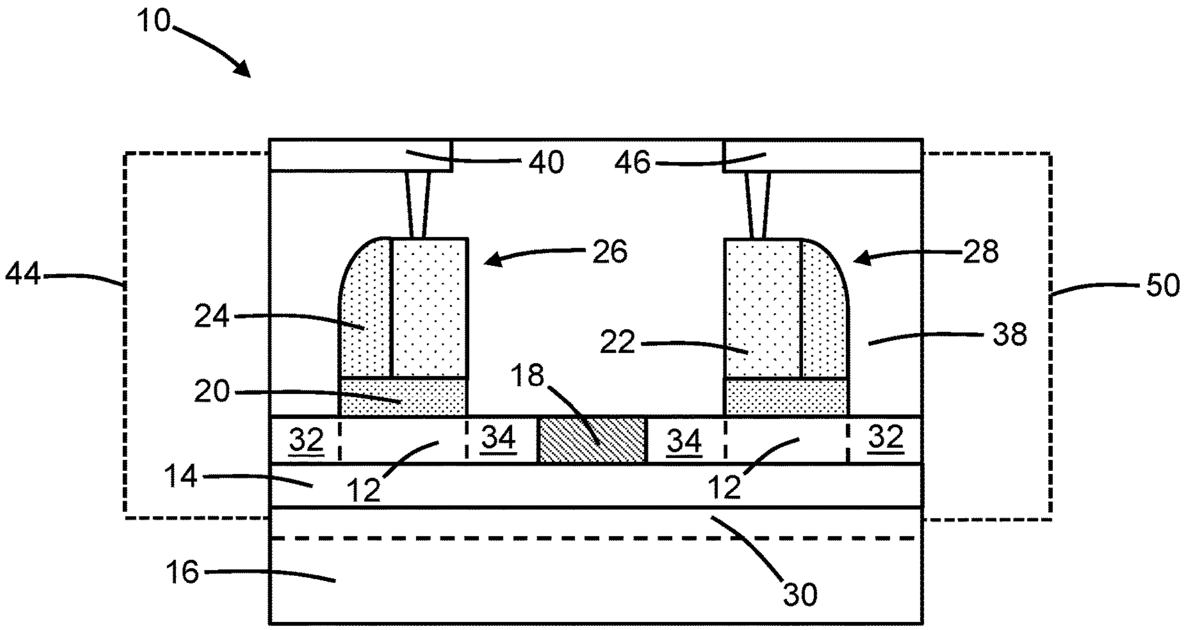

With reference to FIGS. 5, 5A in which like reference numerals refer to like features in FIG. 4 and at a subsequent fabrication stage, the structure 10 may be configured as a ferroelectric capacitive memory device that includes the electrode 26 as a top electrode and the doped regions 32, 34 associated with the electrode 26 as a bottom electrode, and a ferroelectric capacitive memory device that includes the electrode 28 as a top electrode and the doped regions 32, 34 associated with the electrode 28 as a bottom electrode. To that end, an interconnect structure may be formed by back-end-of-line processing that includes one or more interlayer dielectric layers 38, an interconnection 40 coupled to the electrode 26, an interconnection 42 coupled to the doped regions 32, 34 associated with the electrode 26, an interconnection 44 coupling the doped region 30 beneath the electrode 26 to the interconnection 40, an interconnection 46 coupled to the electrode 28, an interconnection 48 coupled to the doped regions 32, 34 associated with the electrode 28, and an interconnection 50 coupling the doped region 30 beneath the electrode 28 to the interconnection 46. The interconnection 44 ties the back gate embodied in the doped region 30 to the electrode 26, and the interconnection 50 ties the back gate embodied in the doped region 30 to the electrode 28. Each of the interconnections 40, 42, 44, 46, 48, 50 may include vias and wiring arranged in the one or more interlayer dielectric layers 38.

The ferroelectric material constituting the ferroelectric layer 20 is characterized by a pair of stable remanent polarization states that are persistent and that can be reversibly varied in response to an electric field applied between the respective electrodes of each ferroelectric capacitive memory device. The pair of stable remanent polarization states represent binary logic states in a ferroelectric capacitive memory device. In one remnant polarization state, the net polarization of the ferroelectric material in the crystalline grains may be oriented parallel to each other, which may provide a low capacitance state. In the other remnant polarization state, the net polarization of the ferroelectric material in the crystalline grains may be oriented anti-parallel to each other, which may provide a high capacitance state. The low and high capacitance states of the remnant polarization states enable the different binary logic states. The back gate provided by the doped region 30 may be biased to enhance the electric field used to provide the different binary logic states.

The hybrid electrodes 26, 28 containing materials of different work function may improve the performance of each ferroelectric capacitive memory device. In that regard, the electrode layer 22 of lower work function may enhance electron injection, especially in combination with additional biasing by the back gate provided by the doped region 30, such that the efficiency of programming the high-capacitance state is enhanced. The electrode layer 24 of higher work function may increase surface accumulation of the doped regions 32, 34 and may increase the threshold voltage, which may significantly increase band-to-band tunneling and/or gate-induced drain leakage and thereby enhance the efficiency of programming the low-capacitance state.

Figure 6:
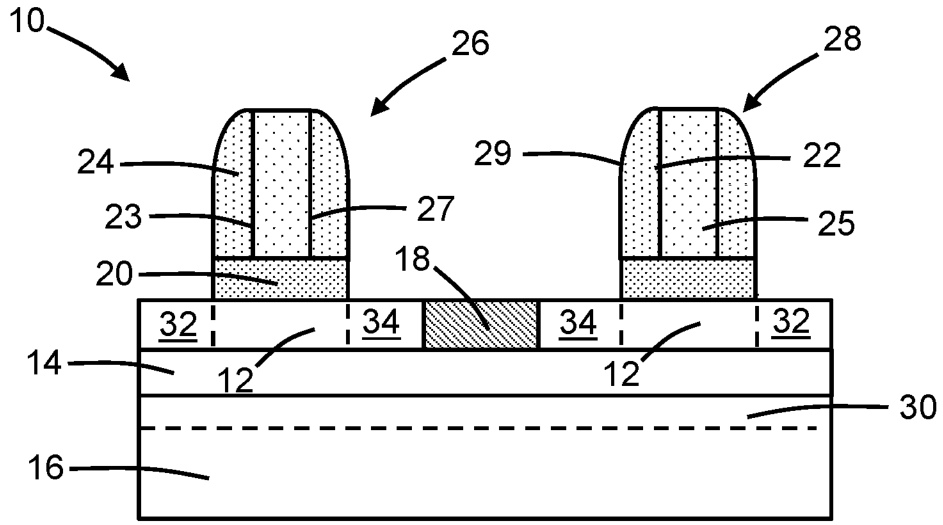
FIG. 6 is a cross-sectional view of a structure in accordance with alternative embodiments of the invention.

With reference to FIG. 6 and in accordance with alternative embodiments, the electrode layer 22 may be patterned into sections followed by the formation of sections of the electrode layer 24, the patterning of the ferroelectric layer 20, and the formation of the doped regions 32, 34.

The electrode 26 includes one of the sections of the electrode layer 22 and a pair of sections of the electrode layer 24 that are respectively positioned adjacent to the sidewall 23 and the sidewall 27 of the electrode layer 22. The section of the electrode layer 22 of the electrode 26 is laterally disposed between the sections of the electrode layer 24 of the electrode 26. In an embodiment, the section of the electrode layer 22 of the electrode 26 may be coextensive with each section of the electrode layer 24 of the electrode 26. In an embodiment, the sections of the electrode layer 24 of the electrode 26 may be in direct contact with the opposite sidewalls 23 and 27 of the section of the electrode layer 22 of the electrode 26.

The electrode 28 includes one of the sections of the electrode layer 22 and a pair of sections of the electrode layer 24 that are respectively positioned adjacent to the sidewall 25 and the sidewall 29 of the electrode layer 22. The section of the electrode layer 22 of the electrode 28 is laterally disposed between the sections of the electrode layer 24 of the electrode 28. In an embodiment, the section of the electrode layer 22 of the electrode 28 may be coextensive with each section of the electrode layer 24 of the electrode 28. In an embodiment, the sections of the electrode layer 24 of the electrode 28 may be in direct contact with the sidewalls 25 and 29 of the section of the electrode layer 22. In an embodiment, the section of the electrode layer 22 of the electrode 28 may be coextensive with each section of the electrode layer 24 of the electrode 28.

In an embodiment, the sections of the electrode layer 24 may be comprised of a material having a work function that is greater than the work function of the electrode layer 22. In an alternative embodiment, the materials of the sections of the electrode layer 24 and the electrode layer 22 may be swapped.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a ferroelectric capacitive memory device, the structure comprising:

a semiconductor substrate including a back gate;

a semiconductor layer;

a dielectric layer between the semiconductor layer and the semiconductor substrate;

a first electrode including a first doped region in the semiconductor layer and a second doped region in the semiconductor layer;

a first interconnection configured to connect the first doped region to the second doped region;

a ferroelectric layer on the semiconductor layer; and a second electrode including a first section and a second section on the ferroelectric layer, the first section of the second electrode comprising a first material with a first work function, and the second section of the second electrode comprising a second material with a second work function that is greater than the first work function of the first material.

2. The structure of claim 1 wherein the first section of the second electrode directly contacts the second section of the second electrode.

3. The structure of claim 2 wherein the first section of the second electrode and the second section of the second electrode have a juxtaposed relationship.

4. The structure of claim 1 wherein the ferroelectric layer is disposed fully between the first section of the second electrode and the semiconductor layer, and the ferroelectric layer is disposed fully between the second section of the second electrode and the semiconductor layer.

5. The structure of claim 4 wherein the first section of the second electrode directly contacts a first portion of the ferroelectric layer, and the second section of the second electrode directly contacts a second portion of the ferroelectric layer.

6. The structure of claim 5 wherein the first section of the second electrode laterally adjoins the second section of the second electrode.

7. The structure of claim 1 further comprising:

a second interconnection connected to the second electrode; and a third interconnection that is configured to connect the back gate to the second interconnection.

8. The structure of claim 1 wherein the ferroelectric layer is disposed between the second electrode and the semiconductor layer.

9. The structure of claim 1 wherein the second electrode includes a third section, the first section is disposed laterally between the second section and the third section, and the third section comprises the second material.

10. The structure of claim 9 wherein the first section of the second electrode is coextensive with the second section of the second electrode, and the first section of the second electrode is coextensive with the third section of the second electrode.

11. The structure of claim 1 wherein the second electrode includes a third section, the second section is disposed laterally between the first section and the third section, and the third section comprises the first material.

12. The structure of claim 11 wherein the second section of the second electrode is coextensive with the first section of the second electrode, and the second section of the second electrode is coextensive with the third section of the second electrode.

13. The structure of claim 1 wherein the first material is p-type polysilicon, titanium nitride, tantalum nitride, aluminum, copper or a combination of these materials, and the second material is n-type polysilicon.

14. The structure of claim 1 wherein the first section of the second electrode is coextensive with the second section of the second electrode.

15. The structure of claim 14 wherein the ferroelectric layer is disposed fully between the first section of the second electrode and the semiconductor layer, and the ferroelectric layer is disposed fully between the second section of the second electrode and the semiconductor layer.

16. The structure of claim 1 wherein the first section of the second electrode laterally adjoins the second section of the second electrode.

17. The structure of claim 1 wherein the second electrode is disposed laterally between the first doped region and the second doped region.

18. The structure of claim 17 wherein the ferroelectric layer is disposed laterally between the first doped region and the second doped region.

19. A method of forming a structure for a ferroelectric capacitive memory device, the method comprising:

forming a ferroelectric layer on a semiconductor layer, wherein a dielectric layer is positioned between the semiconductor layer and a semiconductor substrate, and the semiconductor substrate includes a back gate;

forming a first electrode that includes a first doped region in the semiconductor layer and a second doped region in the semiconductor layer;

forming a second electrode that includes a first section and a second section on the ferroelectric layer, wherein the first section of the second electrode comprises a first material with a first work function, and the second section of the second electrode comprises a second material with a second work function that is greater than the first work function of the first material; and forming a first interconnection that is configured to connect the first doped region to the second doped region.

20. The method of claim 19 further comprising:

forming a second interconnection connected to the second electrode; and forming a third interconnection that is configured to connect the back gate to the second interconnection.

* * * * *